US012648367B1

(12) United States Patent　　　(10) Patent No.:　US 12,648,367 B1
Najafi　　　　　　　　　　　　　　(45) Date of Patent:　Jun. 2, 2026

(54) SUPERCONDUCTING DEVICE WITH ASYMMETRIC IMPEDANCE

(71) Applicant: PsiQuantum Corp., Palo Alto, CA (US)

(72) Inventor: Faraz Najafi, Palo Alto, CA (US)

(73) Assignee: PsiQuantum Corp., Palo Alto, CA (US)

( * ) Notice: Subject to any disclaimer, the term of this patent is extended or adjusted under 35 U.S.C. 154(b) by 424 days.

(21) Appl. No.: 18/380,614

(22) Filed: Oct. 16, 2023

Related U.S. Application Data

(63) Continuation of application No. 17/826,088, filed on May 26, 2022, now Pat. No. 11,793,090, which is a continuation of application No. 17/033,337, filed on Sep. 25, 2020, now Pat. No. 11,380,731.

(60) Provisional application No. 62/906,680, filed on Sep. 26, 2019.

(51) Int. Cl.
　　*H10N 69/00*　　　(2026.01)
　　*H10N 60/30*　　　(2023.01)
(52) U.S. Cl.
　　CPC ............. *H10N 69/00* (2023.02); *H10N 60/30* (2023.02)
(58) Field of Classification Search
　　CPC ............................... H10N 69/00; H10N 60/30
　　See application file for complete search history.

(56) References Cited

U.S. PATENT DOCUMENTS

| 3,059,196 A | 10/1962 | Lentz |
| 3,119,076 A | 1/1964 | Schlig et al. |
| 3,283,282 A | 11/1966 | Rosenberg |

(Continued)

FOREIGN PATENT DOCUMENTS

| CN | 106289515 A | 1/2017 |
| CN | 106549099 A | 3/2017 |

(Continued)

OTHER PUBLICATIONS

McCaughan, A.N., et al. "Using Geometry to Sense Current." Nano Letters 16 (2016), 6 pgs.

(Continued)

*Primary Examiner* — Shahed Ahmed
*Assistant Examiner* — Khatib A Rahman
(74) *Attorney, Agent, or Firm* — Morgan, Lewis & Bockius LLP

(57)　　　　　　　ABSTRACT

An electronic component having an asymmetric impedance is provided. The component includes first, second and third branches that connect at a common node. The component includes a first portion of superconducting material disposed along the first branch and a second portion of superconducting material disposed along the second branch. The component includes a first device disposed along the first branch and configured to transition the second portion of the superconducting material to a non-superconducting state when a current between a first terminal of the first device and a second terminal of the first device exceeds a first threshold value and a second device disposed along the second branch and configured to transition the first portion of the superconducting material to a non-superconducting state when a current between a first terminal of the second device and a second terminal of the second device exceeds a second threshold value.

20 Claims, 7 Drawing Sheets

(56) References Cited

U.S. PATENT DOCUMENTS

| | | | |
|---|---|---|---|
| 4,336,561 A | 6/1982 | Murphy |
| 4,365,317 A | 12/1982 | Gheewala |
| 4,509,146 A | 4/1985 | Wang et al. |
| 4,647,954 A | 3/1987 | Graf et al. |
| 4,989,051 A | 1/1991 | Whitehead et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Kroulik |
| 9,443,576 B1 | 9/2016 | Miller |
| 9,500,519 B2 | 11/2016 | Tang et al. |
| 9,509,315 B2 | 11/2016 | McCaughan et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,547,314 B1 * | 1/2020 | Braun ................. H03K 19/195 |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,886,902 B2 * | 1/2021 | Braun ..................... H03K 3/38 |
| 10,897,235 B2 | 1/2021 | Najafi et al. |
| 10,911,031 B2 | 2/2021 | Wise et al. |
| 10,944,403 B2 | 3/2021 | Najafi |
| 11,009,387 B2 | 5/2021 | Chung et al. |

| | | | |
|---|---|---|---|
| 11,380,731 B1 | 7/2022 | Najafi |
| 11,793,090 B1 | 10/2023 | Najafi |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0083327 A1 | 8/2006 | Moon |
| 2006/0270224 A1 | 11/2006 | Song et al. |
| 2006/0274458 A1 * | 12/2006 | Tekletsadik .......... H10N 60/355 |
| | | | 361/19 |
| 2006/0279388 A1 * | 12/2006 | Tekletsadik .............. H01F 6/00 |
| | | | 335/216 |
| 2008/0026234 A1 | 1/2008 | Sambasivan et al. |
| 2008/0197285 A1 | 8/2008 | Frey et al. |
| 2008/0272302 A1 | 11/2008 | Frey et al. |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang et al. |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1 | 6/2013 | Marsili et al. |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1 | 1/2016 | McCughan et al. |
| 2016/0356708 A1 | 12/2016 | Bennett et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0226974 A1 * | 8/2018 | Harms ................... H03K 19/21 |
| 2018/0335343 A1 | 11/2018 | Najafi et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |
| 2019/0035999 A1 | 1/2019 | Najafi |
| 2019/0044051 A1 | 2/2019 | Caudillo et al. |
| 2019/0109595 A1 * | 4/2019 | Najafi .................... H10N 60/30 |
| 2019/0140157 A1 | 5/2019 | Najafi et al. |
| 2019/0148848 A1 | 5/2019 | Najafi et al. |
| 2019/0227230 A1 | 7/2019 | Novack et al. |
| 2019/0288132 A1 | 9/2019 | Wang et al. |
| 2019/0378874 A1 | 12/2019 | Rosenblatt et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0176662 A1 | 6/2020 | Dayton et al. |
| 2020/0186132 A1 * | 6/2020 | Braun ..................... H03K 3/38 |
| 2020/0194656 A1 | 6/2020 | Najafi |
| 2020/0256722 A1 | 8/2020 | Najafi et al. |
| 2020/0259483 A1 * | 8/2020 | Wise ......................... H01F 6/06 |
| 2021/0183767 A1 | 6/2021 | Najafi et al. |
| 2021/0239518 A1 | 8/2021 | Chung et al. |

FOREIGN PATENT DOCUMENTS

| | | | |
|---|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO9014715 A1 | 11/1990 |

(56)          References Cited

FOREIGN PATENT DOCUMENTS

WO          WO9409566 A1     4/1994
WO          WO2012052628 A1     4/2012

OTHER PUBLICATIONS

Akhlaghi et al., "Gated Mode145:149 Superconducting Nanowire Single Photon Detectors," Optics Express, vol. 20, No. 2, Jan. 16, 2012, 9 pgs.
Atikian, Haig A. et al., "Superconducting Nanowire Single Photon Detector on Diamond," arXiv:1401.4490v1, physics.optics, Jan. 17, 2014, 5 pgs.
Cheng, Risheng et al., "Photon-Number-Resolving Detector Based on Superconducting Serial Nanowires," IEEE Transactions on Applied Superconductivity, vol. 23, No. 1, Feb. 2013, 9 pgs.
Clem, John R. et al., "Geometry-dependent critical currents in superconducting nanocircuits," arXiv:1109.4881v1 [cond-mat.supr-con] Sep. 22, 2011, 29 pgs.
Dai, Daoxin et al., "Mode conversion in tapered submicron silicon ridge optical waveguides," Optics Express, vol. 20, No. 12, Jun. 4, 2012, 15 pgs.
Henrich, D. et al., "Geometry-inducted reduction of the critical current in superconducting nanowires," arXiv:1204.0616v2 [cond-mat-supr-con] Aug. 22, 2012, 6 pgs.
Hortensius, H.L. et al., "Critical-Current Reduction in Thin Superconducting Wires Due to Current Crowding," arXiv:1203.4253v3, [cond-mat-supr-con], May 6, 2012, 5 pgs.
Korzh, B.A. et al., "Demonstrating sub-3 ps temporal resolution in a superconducting nanowire single-photon detector," Apr. 18, 2018, 26 pgs.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-number-resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.
Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.
Natarajan et al., "Superconducting nanowire single-photon detectors: physics and applications", 2012, Superconduc. Sci. Technology vol. 25, p. 063001.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, Aug. 28, 2018, 13 pgs.
PsiQuantum Corp., International Search Report and Written Opinion, PCT/US2018/033041, Jul. 27, 2018, 16 pgs.
PsiQuantum Corp., International Search Report and Written Opinion, PCT/US2018/044091, Nov. 7, 2018, 13 pgs.
PsiQuantum Corp., Invitation to Pay Additional Fees/Partial Search Report, PCT/US2018/037892, Aug. 20, 2018, 12 pgs.
PsiQuantum Corp., Invitation to Pay Additional Fees/Partial Search Report, PCT/US2018/054414, Jan. 24, 2019, 21 pgs.
PsiQuantum Corp., International Search Report and Written Opinion, PCT/US2018/054414, Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 8 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Office Action, U.S. Appl. No. 16/136,124, filed Apr. 4, 2019, 9 pgs.
Najafi, Quayle Office Action, U.S. Appl. No. 16/151,180, filed Jan. 31, 2019, 5pgs.
Najafi, Notice of Allowace, U.S. Appl. No. 16/151,180, filed Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, filed Feb. 4, 2019, 9 pgs.
Najafi, Office Action, U.S. Appl. No. 16/046,807, filed Mar. 18, 2019, 10 pgs.
Najafi, Office Action, U.S. Appl. No. 16/107,143, filed Mar. 19, 2019, 11 pgs.
PSIQUANTUM CORP., International Search Report and Written Opinion, PCT/US2019/017687, Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PSIQUANTUM Corp., International Search Report, PCT/US2019/017691, Apr. 23, 2019, 7 pgs.
PSIQUANTUM Corp., International Search Report and Written Opinion, PCT/US2019/030019, Jul. 17, 2019, 8 pgs.
PSIQUANTUM Corp., PCT/US2018/044091, International Preliminary Report on Patentability, Jan. 28, 2020, 6 pgs.
Najafi, Non-Final Office Action, U.S. Appl. No. 16/664,716, filed Apr. 1, 2020, 14 pgs.
PSIQUANTUM, International Search Report / Written Opinion, PCT/US2019/051853, Jan. 27, 2020, 13 pgs.
PSIQUANTUM, International Preliminary Report on Patentability, PCT/US12018/033041, Nov. 26, 2019, 8 pgs.
PSIQUANTUM, International Preliminary Report on Patentability, PCT/US2018/054414, Apr. 8, 2020, 15 pgs.
PSIQUANTUM, International Search Report / Written Opinion, PCT/US2018/037892, Oct. 17, 2018, 18 pgs.
PSIQUANTUM, International Preliminary Report on Patentability, PCT/US2018/037892, Dec. 17, 2019, 12 pgs.
Najafi, Non-Final Office Action, U.S. Appl. No. 16/553,068, filed Apr. 1, 2020, 11 pgs.
Najafi, Non-Final Office Action, U.S. Appl. No. 16/544,718, filed Aug. 17, 2020, 6 pgs.
Najafi, Non-Final Office Action, U.S. Appl. No. 16/656,506, filed Aug. 13, 2020, 18 pgs.
Najafi, Notice of Allowance, U.S. Appl. No. 16/553,068, filed Sep. 18, 2020, 8 pgs.
Najafi, Notice of Allowance, U.S. Appl. No. 16/473,550, filed Sep. 24, 2020, 8 pgs.
Najafi, Notice of Allowance, U.S. Appl. No. 16/473,550, filed Nov. 3, 2020, 2 pgs.
Najafi, Notice of Allowance, U.S. Appl. No. 16/553,068, filed Nov. 12, 2020, 2 pgs.

(56)            References Cited

OTHER PUBLICATIONS

Najafi, Notice of Allowance, U.S. Appl. No. 16/656,506, filed Nov. 3, 2020, 12 pgs.

Najafi, Final Office Action, U.S. Appl. No. 16/664,716, filed Oct. 16, 2020, 14 pgs.

Najafi, Notice of Allowance, U.S. Appl. No. 16/473,547, filed Dec. 9, 2020, 8 pgs.

Najafi, Notice of Allowance, U.S. Appl. No. 16/543,256, filed Dec. 9, 2020, 12 pgs.

Chung, Non-Final Office Action, U.S. Appl. No. 16/849,829, filed Aug. 21, 2020, 5 pgs.

Chung, Notice of Allowance, U.S. Appl. No. 16/849,829, filed Dec. 8, 2020, 5 pgs.

PSIQUANTUM Corp., International Search Report / Written Opinion, PCT/US20/28519, Jan. 12, 2021, 9 pgs.

PSIQUANTUM Corp., Notice of Allowance, U.S. Appl. No. 16/849,829, filed Mar. 1, 2021, 8 pgs.

PSIQUANTUM Corp., Notice of Allowance, U.S. Appl. No. 16/544,718, filed Feb. 5, 2021, 6 pgs.

PSIQUANTUM Corp., Notice of Allowance, U.S. Appl. No. 16/664,716, filed Jan. 28, 2021, 8 pgs.

PSIQUANTUM Corp., Notice of Allowance, U.S. Appl. No. 16/473,547, filed Jan. 27, 2021, 2 pgs.

PSIQUANTUM Corp., Notice of Allowance, U.S. Appl. No. 16/543,256, filed Feb. 4, 2021, 2 pgs.

PSIQUANTUM Corp., Notice of Allowance, U.S. Appl. No. 16/544,718, filed Mar. 12, 2021, 2 pgs.

PSIQUANTUM Corp., Notice of Allowance, U.S. Appl. No. 16/544,718, filed Mar. 24, 2021, 2 pgs.

PSIQUANTUM Corp., Notice of Allowance, U.S. Appl. No. 16/849,829, filed Apr. 5, 2021, 2 pgs.

PSIQUANTUM, Notice of Allowance, U.S. Appl. No. 16/840,166, filed Mar. 23, 2021, 7 pgs.

PSIQUANTUM, Notice of Allowance, U.S. Appl. No. 16/544,718, filed Apr. 26, 2021, 2 pgs.

PSIQUANTUM, Notice of Allowance, U.S. Appl. No. 16/664,716, filed Apr. 21, 2021, 8 pgs.

PSIQUANTUM, Notice of Allowance, U.S. Appl. No. 16/664,716, filed May 7, 2021, 2 pgs.

PSIQUANTUM, Notice of Allowance, U.S. Appl. No. 16/543,256, filed Mar. 24, 2021, 2 pgs.

PSIQUANTUM, Notice of Allowance, U.S. Appl. No. 16/575,274, filed Apr. 22, 2021, 10 pgs.

PSIQUANTUM, International Preliminary Report on Patentability, PCT/US2018/033042, Nov. 19, 2019, 7 pgs.

PSIQUANTUM, International Search Report, PCT/US2018/033041, Jul. 27, 2018, 12 pgs.

PSIQUANTUM, International Preliminary Report on Patentability, PCT/US2019/051853, Mar. 23, 2021, 10 pgs.

PSIQUANTUM, International Preliminary Report on Patentability, PCT/US2019/017687, Aug. 18, 2020, 6 pgs.

PSIQUANTUM, International Preliminary Report on Patentability, PCT/US2019/030019, Nov. 3, 2020, 7 pgs.

PSIQUANTUM, Notice of Allowance, U.S. Appl. No. 16/840,166, filed May 24, 2021, 5 pgs.

Najafi, Non-Final Office Action, U.S. Appl. No. 16/623,503, filed Jun. 23, 2021, 15 pgs.

Najafi, Notice of Allowance, U.S. Appl. No. 16/840,166, filed Jul. 21, 2021, 2 pgs.

Najafi, Non-Final Office Action, U.S. Appl. No. 17/135,861, filed Sep. 23, 2021, 6 pgs.

PSIQUANTUM, International Preliminary Report on Patentability, PCT/US2019/016885, Aug. 11, 2020, 7 pgs.

PSIQUANTUM, International Search Report and Written Opinion, PCT/US2019/016885, Apr. 24, 2019, 9 pgs.

Thompson, Non-Final Office Action, U.S. Appl. No. 16/450,911, filed Aug. 2, 2019, 6 pgs.

Thompson, Notice of Allowance, U.S. Appl. No. 16/450,911, filed Dec. 11, 2019, 5 pgs.

Thompson, Non-Final Office Action, U.S. Appl. No. 16/985,137, filed Sep. 30, 2021, 6 pgs.

Najafi, Notice of Allowance, U.S. Appl. No. 16/046,807, filed Oct. 29, 2019, 7 pgs.

Najafi, Notice of Allowance, U.S. Appl. No. 16/136,124, filed Apr. 4, 2019, 8 pgs.

Najafi, Notice of Allowance, U.S. Appl. No. 16/136,124, filed Jun. 27, 2019, 8 pgs.

Najafi, Corrected Notice of Allowance, U.S. Appl. No. 16/136,124, filed Sep. 23, 2019, 2 pgs.

PSIQUANTUM Corp., International Search Report and Written Opinion, PCT/US2018/060802, Apr. 8, 2019, 6 pgs.

PSIQUANTUM, International Preliminary Report on Patentability, PCT/US2018/060802, May 19, 2020, 13 pgs.

Najafi, Notice of Allowance, U.S. Appl. No. 16/773,921, filed Sep. 22, 2021, 8 pgs.

Najafi, Notice of Allowance, U.S. Appl. No. 17/195,522, filed Nov. 12, 2021, 8 pgs.

Najafi, Notice of Allowance, U.S. Appl. No. 17/195,522, filed Nov. 16, 2021, 2 pgs.

Najafi, Notice of Allowance, U.S. Appl. No. 16/773,921, filed Nov. 15, 2021, 8 pgs.

Najafi, Notice of Allowance, U.S. Appl. No. 17/033,337, filed Dec. 9, 2021, 8 pgs.

Chung, Non-Final Office Action, U.S. Appl. No. 17/232,086, filed Dec. 16, 2021, 6 pgs.

Najafi, Notice of Allowance, U.S. Appl. No. 17/195,522, filed Dec. 9, 2021, 2 pgs.

Najafi, Notice of Allowance, U.S. Appl. No. 16/773,921, filed Dec. 24, 2021, 2 pgs.

Najafi, Notice of Allowance, U.S. Appl. No. 17/195,522, filed Jan. 7, 2022, 2 pgs.

Najafi, Notice of Allowance, U.S. Appl. No. 17/135,861, filed Jan. 28, 2022, 7 pgs.

Thompson, Non-Final Office Action, U.S. Appl. No. 16/985,137, filed Jan. 18, 2022, 8 pgs.

Najafi, Notice of Allowance, U.S. Appl. No. 16/623,503, filed Feb. 22, 2022, 10 pgs.

Najafi, Notice of Allowance, U.S. Appl. No. 17/195,522, filed Feb. 9, 2022, 2 pgs.

Najafi, Notice of Allowance, U.S. Appl. No. 17/135,861, filed Feb. 15, 2022, 2 pgs.

Najafi, Notice of Allowance, U.S. Appl. No. 16/773,921, filed Feb. 16, 2022, 2 pgs.

Najafi, Non-Final Office Action, U.S. Appl. No. 16/813,628, filed Mar. 7, 2022, 7 pgs.

Najafi, Notice of Allowance, U.S. Appl. No. 17/135,861, filed Mar. 15, 2022, 2 pgs.

Najafi, Notice of Allowance, U.S. Appl. No. 16/623,503, filed Mar. 11, 2022, 3 pgs.

Najafi, Notice of Allowance, U.S. Appl. No. 16/623,503, filed Mar. 22, 2022, 3 pgs.

Najafi, Notice of Allowance, U.S. Appl. No. 17/826,088, filed Jun. 1, 2023, 8 pgs.

* cited by examiner

Superconducting layer 606

614

Device 610

Protective layer 612

Superconductor Layer 606

Insulating Layer 604

Superconductor Layer 608

Substrate 602

Circuit 700

SUPERCONDUCTING DEVICE WITH ASYMMETRIC IMPEDANCE

PRIORITY AND RELATED APPLICATIONS

This application is a continuation of U.S. patent application Ser. No. 17/826,088, filed May 26, 2022, entitled "Superconducting Device with Asymmetric Impedance," which is a continuation of U.S. patent application Ser. No. 17/033,337, filed Sep. 25, 2020, entitled "Superconducting Device with Asymmetric Impedance," which claims priority to U.S. Provisional Patent Application No. 62/906,680, filed Sep. 26, 2019, entitled "Superconducting Device with Asymmetric Impedance," each of which is hereby incorporated by reference in its entirety.

This application relates to U.S. patent application Ser. No. 16/136,124, filed Sep. 19, 2018, entitled "Methods and Devices for Impedance Multiplication," now U.S. Pat. No. 10,461,445, and U.S. patent application Ser. No. 16/107,143, filed Aug. 21, 2018, entitled "Superconductor-to-Insulator Devices," now U.S. Pat. No. 10,573,800, each of which is incorporated by reference in its entirety.

TECHNICAL FIELD

This relates generally to electronic devices (e.g., diodes) having an asymmetric conductance (e.g., asymmetric impedance) between terminals and, more specifically, to diodes that operate based on the properties of superconducting materials.

BACKGROUND

Impedance is a measure of the opposition to current flow in an electrical circuit. Superconductors are materials capable of operating in a superconducting state with zero electrical resistance under particular conditions. Additionally, in some circumstances, superconductors have high impedance while in a non-superconducting state. Moreover, superconductors generate heat when operating in a non-superconducting state, as well as when transitioning from a superconducting state to a non-superconducting state.

Metals and other materials with non-zero resistance generate resistive heat when a current flows through them. The amount of heat generated is based on a current density, and thus is based on a width of a wire carrying the current.

SUMMARY

The present disclosure provides thin-film diode devices based on superconducting materials, thereby utilizing advantages of superconducting materials (e.g., zero resistance under certain conditions). In addition, diodes that are superconducting can be integrated more easily (e.g., monolithically) with other superconducting components in circuits and devices. Such circuits and devices are often used for making sensitive measurements. For example, superconducting circuits play a critical role in superconducting quantum interference devices (SQUIDs). Superconducting components also play an important role in sensitive optical measurements. For these purposes, there is a need for diodes whose operating principles are based on the properties of superconducting materials.

To that end, some embodiments of the present disclosure provide an electronic component. The electronic component includes first, second and third branches that connect at a common node. The electronic component includes a first portion of superconducting material disposed along the first branch and a second portion of superconducting material disposed along the second branch. The electronic component includes a first device disposed along the first branch. The first device is configured to transition the second portion of the superconducting material to a non-superconducting state when a current between a first terminal of the first device and a second terminal of the first device exceeds a first threshold value. The electronic component includes a second device disposed along the second branch. The second device is configured to transition the first portion of the superconducting material to a non-superconducting state when a current between a first terminal of the second device and a second terminal of the second device exceeds a second threshold value.

Further, some embodiments of the present disclosure provide another electronic component. The electronic component has a first end and a second end. The electronic component includes first, second and third branches that connect at a common node. The first branch terminates at the first end and the third branch terminates at the second end. The first branch includes a first portion of superconducting material and a first device coupled in series. The second branch includes a second portion of superconducting material and a second device coupled in series. The second device is configured to control a state of the first portion of superconducting material and the first device is configured to control a state of the second portion of superconducting material, such that a first signal applied to the first end flows to the second end while the first portion of superconducting material remains in a superconducting state, and a second signal applied to the second end causes a current to flow through the second device and transition the first portion of superconducting material from the superconducting state to a non-superconducting state.

Thus, devices and circuits are provided with methods for operating superconducting components, thereby increasing the effectiveness and efficiency of such circuits and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1:
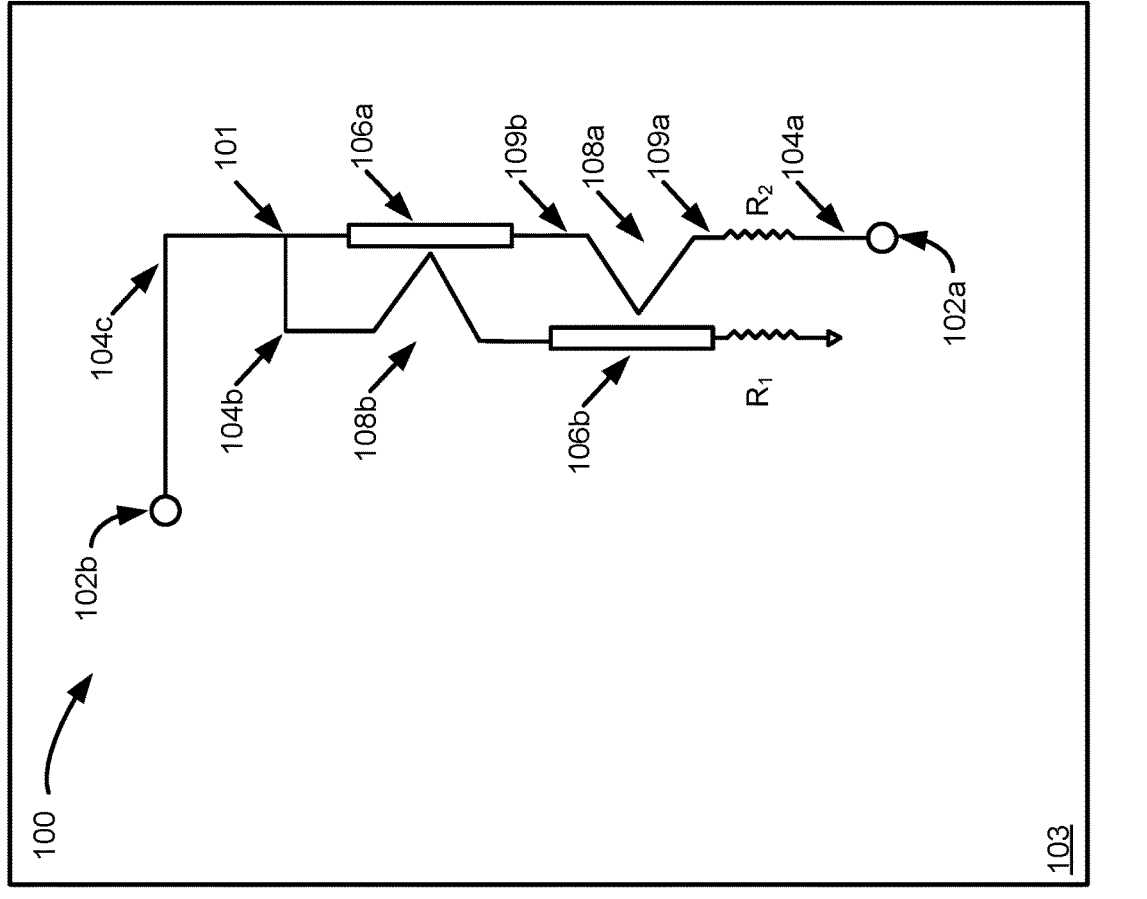
FIG. 1 is a schematic representation of an electronic component with asymmetric impedance, in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called a superconduction-capable material. In some embodiments, the superconducting materials operate in an "off" state when supplied with a current less than a threshold current, and operate in an "on" state when supplied with a current greater than the threshold current. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance.

As used herein, a "wire" is a section of material configured for transferring electrical current. In some embodiments, a wire includes a section of material conditionally capable of transferring electrical current, e.g., a wire made of a superconducting material that is capable of transferring electrical current while the wire is maintained at a temperature below a threshold temperature. As another example, a wire made of semiconducting material is capable of transferring electrical current while the wire is maintained at a temperature above a freeze-out temperature. A cross-section of a wire (e.g., a cross-section that is perpendicular to a length of the wire) optionally has a regular (e.g., flat or round) shape or an irregular shape. While some of the figures show wires having rectangular shapes, any shape could be used. In some embodiments, a length of a wire is greater than a width or a thickness of the wire (e.g., the length of a wire is at least 5, 6, 7, 8, 9, or 10 times greater than the width and the thickness of the wire). In some cases, a wire is a section of a superconducting layer.

It should be noted that, although certain embodiments are described below in terms of resistances (e.g., $R_1$, $R_2$, $R_L$), in some circumstances, the devices, components, and methods described herein are used in an alternating current (AC) environment, in which case analogous considerations apply with respect to the more general property of impedance.

FIG. 1 is a schematic representation of an electronic component 100 with asymmetric impedance, in accordance with some embodiments. In some embodiments, electronic component 100 is integrated on a common substrate 103 (e.g., the same substrate). For example, electronic component 100 is a thin-film device fabricated on substrate 103. In some embodiments, various components shown in electronic component 100 comprise instances of layers deposited on substrate 103. In some embodiments, as shown in FIG. 1, the layers are co-planar (e.g., the components are horizontally adjacent to each other). In some embodiments, various layers are stacked, with vias and other appropriate components interconnecting the various components shown in FIG. 1.

Electronic component 100 includes a first branch 104a, a second branch 104b, and a third branch 104c. The first, second, and third branches 104 connect at a common node 101. A first portion of superconducting material 106a is disposed along the first branch 104a and a second portion of superconducting material 106b is disposed along the second branch 104b. In some embodiments, the first portion of superconducting material 106a and the second portion of superconducting material 106b comprise the same superconducting material (e.g., distinct portions or instances of a common layer of superconducting material deposited on substrate 103). In some embodiments, the first portion of superconducting material 106a and the second portion of superconducting material 106b comprise different superconducting materials (e.g., different layers of superconducting material on the common substrate 103). In some embodiments, the first portion of superconducting material 106a and the second portion of superconducting material 106b comprise superconducting nanowires (e.g., wires with a width less than a micron).

A first device 108a is disposed along the first branch 104a. The first device 108a is configured to transition the second portion of superconducting material 106b to a non-superconducting state (e.g., resistive) state when a current between a first terminal 109a of the first device 108a and a second terminal 109b of the first device 108a exceeds a first threshold value. In some embodiments, the first device 108a is electrically insulated from the second portion of superconducting material 106b.

Figures 2A, 2B, 2C:
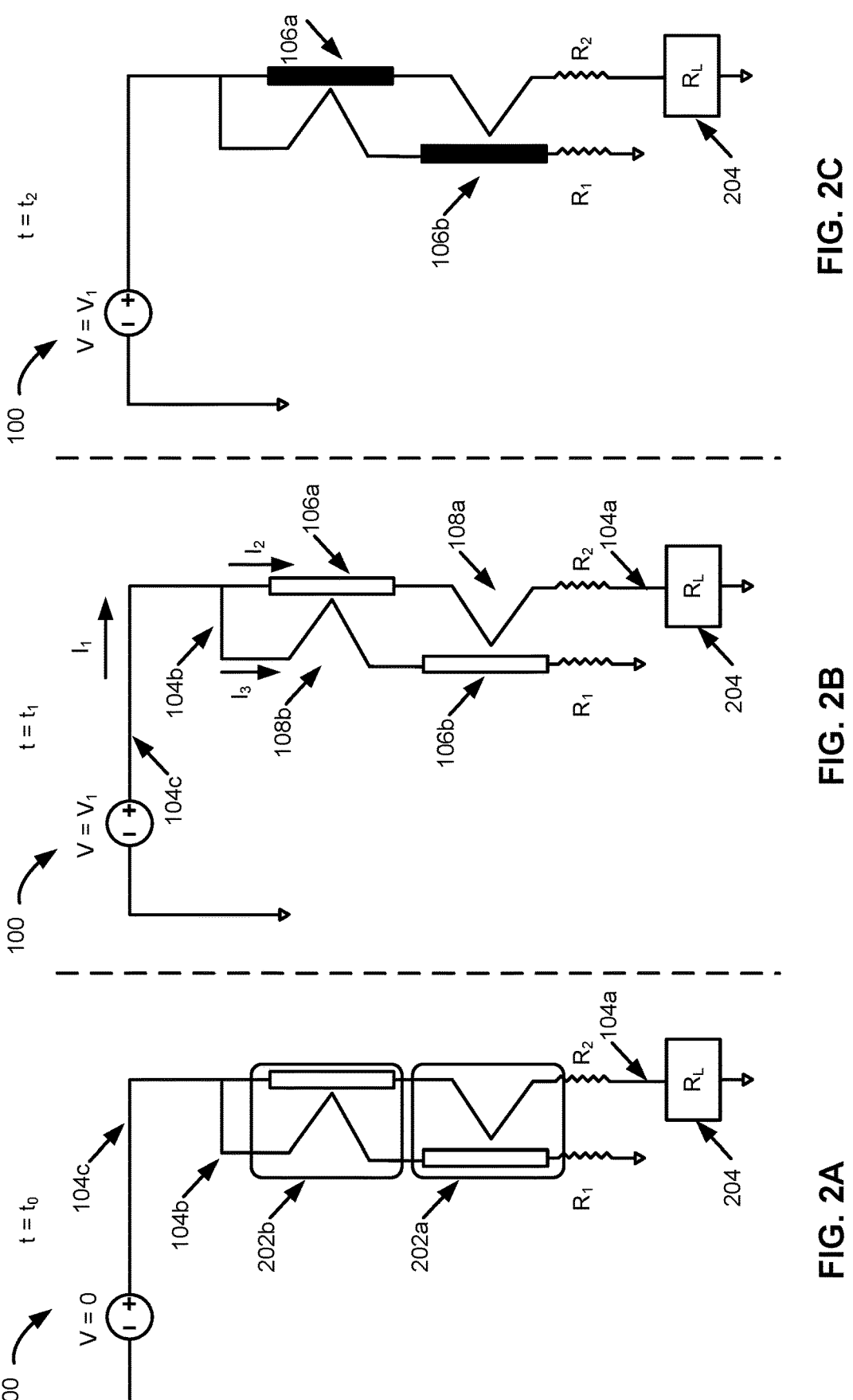
FIGS. 2A-2C are schematic representations of states of the electronic component of FIG. 1 as a signal is applied in one direction across the electronic component, in accordance with some embodiments.

In some embodiments, first device 108a and the second portion of the superconducting material 106b comprise a first impedance amplifier 202a (labeled in FIG. 2A). In some embodiments, the first impedance amplifier 202a is in an "on" state when the current between the first terminal 109a of the first device 108a and the second terminal 109b of the first device 108a exceeds the first threshold value. In some embodiments, the first impedance amplifier 202a is in an "off" state when the current between the first terminal 109a of the first device 108a and the second terminal 109b of the first device 108a does not exceed the first threshold value. In some embodiments, when the first impedance amplifier 202a is in an "on" state, the impedance of the second portion of the superconducting material 106b is greater than the impedance of the first device 108a. In some embodiments, when the first impedance amplifier 202a is in an "off" state, the impedance of the first device 108a is greater than the impedance of the second portion of the superconducting material 106b. Thus, in some embodiments, the second portion of superconducting material 106b is a variable resistor (e.g., having a resistance that depends on whether the second portion of superconducting material 106b is in a superconducting state or a non-superconducting state).

For example, the first device 108a is a heater (e.g., a resistive heating element, as described below with reference to FIG. 4, or a superconducting component configured to transition to a non-superconducting state, as described below with reference to FIG. 6). In some embodiments, as explained in greater detail below, in the absence of current applied to the first device 108a, the second portion of the superconducting material 106b is maintained at a temperature below its threshold temperature (e.g., critical temperature). The first device 108a is electrically isolated from but thermally coupled to the second portion of the superconducting material 106b such that when a current that exceeds the first threshold value is applied across the first device 108a, the second portion of the superconducting material 106b is warmed above its threshold temperature, causing it to transition to a non-superconducting state. In some embodiments, the resistance of the second portion of the superconducting material 106b when in the non-superconducting state is greater than the resistance of the first device 108a.

Similarly, a second device 108b is disposed along the second branch 104b and configured to transition the first portion of the superconducting material 106a to a non-superconducting state when a current between a first terminal of the second device 108b and a second terminal of the second device 108b exceeds a second threshold value. In some embodiments, the second device 108b is electrically insulated from the first portion of superconducting material 106a.

In some embodiments, the second device 108b is also a heater (e.g., a resistive heating element) and thus operates in an analogous manner to first device 108a, as described above. In some embodiments, the second threshold value and the first threshold value are the same (e.g., first device 108a and second device 108b are distinct but are otherwise analogous devices). In some embodiments, the first threshold value and the second threshold value are different. For example, the first threshold value and the second threshold values can be selected to tune a range of operating conditions, as described below.

In some embodiments, the second device 108b and the first portion of superconducting material 106a comprise a second impedance amplifier 202b (e.g., analogous to the first impedance amplifier 202a, described above, but optionally configured such that the second threshold value is different from the first threshold value). Thus, in some embodiments, the first portion of superconducting material 106a is a variable resistor (e.g., having a resistance that depends on whether the first portion of superconducting material 106a is in a superconducting state or a non-superconducting state).

In some embodiments, the first branch 104a has an effective resistance $R_2$ when the first portion of superconducting material 106a is in a superconducting state. In some embodiments, the effective resistance $R_2$ includes one or more resistors. In some embodiments, the effective resistance $R_2$ includes an inherent resistance of the first branch 104a (e.g., a resistance of a wire comprising the first branch 104a). In some embodiments, the first branch 104a includes a resistor connected in series with the first device 108a. In some embodiments, the resistance $R_2$ is or includes the resistance of the first device 108a (which, as noted above, may be a resistive heater).

In some embodiments, the second branch 104b has an effective resistance $R_1$ when the second portion of superconducting material 106b is in a superconducting state. In some embodiments, the effective resistance $R_1$ includes one or more resistors. In some embodiments, the effective resistance $R_1$ includes an inherent resistance of the second branch 104b (e.g., a resistance of a wire comprising the second branch 104b). In some embodiments, the second branch 104b includes a resistor connected in series with the second device 108b. In some embodiments, the resistance Riis or includes the resistance of the second device 108b (which, as noted above, may be a resistive heater). In some embodiments, the resistance $R_2$ of the first branch 104a and the resistance $R_1$ of the second branch 104b are selected to define a predefined range of operating conditions (e.g., applied voltages, currents, and loads) under which electronic component 100 has an asymmetric impedance.

To that end, in some embodiments, the first branch 104a terminates at a first end 102a of the electronic component 100 and the third branch 104c terminates at a second end 102b of the electronic component 100. Under the predefined range of operating conditions (e.g., with a predefined load coupled with the electronic component 100 and for a predefined range of applied currents and/or voltages), the electronic component 100 has a different impedance between the first end 102a and the second end 102b as compared to an impedance between the second end 102b and the first end 102a (e.g., electronic component 100 has an asymmetric impedance). Thus, in some embodiments, electronic component 100 acts as a diode.

In some embodiments, the second portion of superconducting material 106b and the second device 108b are coupled in series. The second device 108b is configured to control a state of the first portion of superconducting material 106a (e.g., control whether the first portion of superconducting material 106a is in a superconducting state or a non-superconducting state). Similarly, the first device 108a is configured to control a state of the second portion of superconducting material 106b (e.g., control whether the first portion of superconducting material 106a is in a superconducting state or a non-superconducting state). A first signal applied to the first end 102a flows to the second end 102b while the first portion of superconducting material 106a remains in a superconducting state, and a second signal applied to the second end 102b causes a current to flow through the second device 108b and transition the first portion of superconducting material 106a from the superconducting state to a non-superconducting state.

Note that, in some embodiments, electronic component 100 is fully passive (e.g., does not require current or voltage biasing). Thus, in some embodiments, electronic component 100 does not consume power when not in use.

FIGS. 2A-2C are schematic representations of states of the electronic component 100 as a signal is applied in a first direction across the electronic component 100 (e.g., from the third branch 104c toward the first branch 104a), in accordance with some embodiments. Note that, in use, the electronic component 100 is maintained at cryogenic temperatures (e.g., temperatures below the critical temperature for any or all of the superconducting components employed by electronic component 100).

In the example shown in FIGS. 2A-2C, the first branch 104*a* is coupled in series with a load 204 (having a resistance $R_L$). In some embodiments, the load 204 comprises a load from circuitry external to electronic component 100. In some embodiments, the resistance $R_L$ of the load 204 is a predefined load. For example, the electronic component 100 is configured to operate, as described herein, when coupled to a load that is within a predefined range of operating loads (e.g., through selection and configuration of threshold currents for the first impedance amplifier 202*a* and the second impedance amplifier 202*b*).

In some embodiments, load 204 is integrated on the same substrate as electronic component 100 (e.g., substrate 103, FIG. 1).

FIG. 2A illustrates electronic component 100 at a first time ($t=t_0$). At the first time, no voltage V is applied between the third branch 104*c* and ground (thus, no signal is applied in a first direction across the electronic component 100 (e.g., from the third branch 104*c* toward the first branch 104*a*)).

FIG. 2B illustrates the electronic component 100 at a second time $t=t_1$ after the first time. The second time is immediately after (e.g., upon) application of a non-zero voltage $V_1$ between the third branch 104*c* and ground (e.g., the second time $t=t_1$ is within a response time of the electronic component 100, such that the electronic component 100 has not yet responded to the application of the non-zero voltage $V_1$). In this example, the opposite ends of the first and second branches 104 (i.e., opposite the common node 101 from the third branch 104*c*) are coupled to ground. For example, the first branch 104*a* is coupled to ground through the load 204 and the second branch 104*b* is coupled directly to ground. Thus, a signal is applied in the first direction across the electronic component 100 (e.g., from the third branch 104*c* toward the first branch 104*a*). The application of the voltage $V_1$ results in a current $I_1$ that is divided between the first branch 104*a* and the second branch 104*b* in accordance with the respective resistances of the two branches. For example, a first portion $I_2$ of the current $I_1$ is directed along the first branch 104*a* and a second portion $I_3$ of the current $I_1$ is directed along the second branch 104*b*.

FIG. 2C illustrates the electronic component 100 at a third time $t=t_2$ after the second time. The third time is more than a response time after application of the voltage $V_1$ shown in FIG. 2B. In this example, the first portion $I_2$ of the current $I_1$ exceeds the first threshold value for the first device 108*a*. Thus, in response to the first portion $I_2$ of the current $I_1$, first device 108*a* transitions the second portion of superconducting material 106*b* to a non-superconducting state (represented by black fill). In some embodiments, the non-superconducting state is an insulating state. In some embodiments, the non-superconducting state is a resistive state.

Further, in this example, the second portion $I_3$ of the current $I_1$ exceeds the second threshold value for the second device 108*b*. Thus, in response to the second portion $I_3$ of the current $I_1$, second device 108*b* transitions the first portion of superconducting material 106*a* to a non-superconducting state. In some embodiments, the non-superconducting state is an insulating state. In some embodiments, the non-superconducting state is a resistive state.

Thus, when a signal is applied in the first direction across the electronic component 100, for at least a predefined range of operating conditions (e.g., predefined ranges for load 204 and voltage $V_1$), the electronic component 100 transitions to a non-superconducting state (e.g., an insulating or resistive state). In some embodiments, zero current or close to zero current flows through electronic component 100 when electronic component 100 is in an insulating state (e.g., as shown in FIG. 2C).

Figures 3A, 3B, 3C:
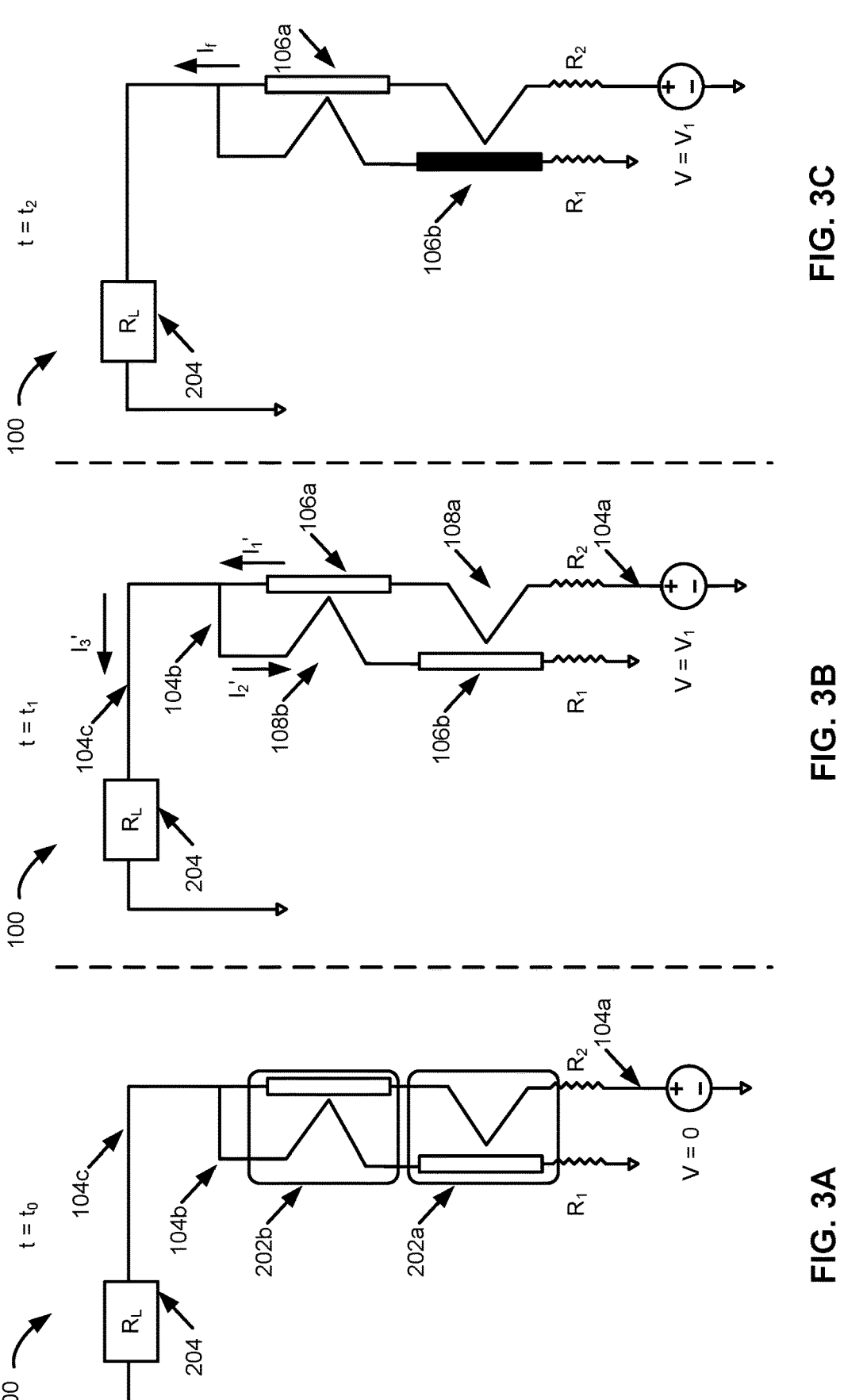
FIGS. 3A-3C are schematic representations of states of the electronic component of FIG. 1 as a signal is applied in the other direction across the electronic component, in accordance with some embodiments.

FIGS. 3A-3C are schematic representations of states of the electronic component 100 as a signal is applied in the other direction (e.g., a second direction) across the electronic component 100 (e.g., from the first branch 104*a* toward the third branch 104*c*), in accordance with some embodiments. In the example shown in FIGS. 3A-3C, the third branch 104*c* is coupled in series with load 204 (having a resistance $R_L$).

Note that, in use, the electronic component 100 is maintained at cryogenic temperatures (e.g., temperatures below the critical temperature for any or all of the superconducting components employed by electronic component 100).

FIG. 3A illustrates electronic component 100 at a first time ($t=t_0$). At the first time, no voltage V is applied between the first branch 104*a* and ground (thus, no signal is applied in the second direction across the electronic component 100 (e.g., from the third branch 104*c* toward the first branch 104*a*)).

FIG. 3B illustrates the electronic component 100 at a second time $t=t_1$ after the first time. The second time is immediately after (e.g., upon) application of a non-zero voltage $V_1$ between the first branch 104*a* and ground (e.g., the second time $t=t_1$ is within a response time of the electronic component 100, such that the electronic component 100 has not yet responded to the application of the non-zero voltage $V_1$).

In this example, the opposite ends of the second and third branches 104 (i.e., opposite the common node 101 from the first branch 104*a*) are coupled to ground. For example, the third branch 104*c* is coupled to ground through the load 204 and the second branch 104*b* is coupled directly to ground. Thus, a signal is applied in the second direction across the electronic component 100 (e.g., from the first branch 104*a* toward the third branch 104*c*). The application of the voltage $V_1$ results in a current $I_1'$ that is divided between the second branch 104*b* and the third branch 104*c* in accordance with the respective resistances of the two branches. For example, a first portion $I_2'$ of the current $I_1'$ is directed along the second branch 104*a* and a third portion $I_3'$ of the current $I_1'$ is directed along the third branch 104*c*.

FIG. 3C illustrates the electronic component 100 at a third time $t=t_2$ after the second time. The third time is more than a response time after application of the voltage $V_1$ shown in FIG. 3B. In this example, the current $I_1'$ exceeds the first threshold value for the first device 108*a*. Thus, in response to the current $I_1'$, first device 108*a* transitions the second portion of superconducting material 106*b* to a non-superconducting state (represented by black fill). In some embodiments, the non-superconducting state is an insulating state (e.g., almost no current flows through the second branch 104*b* when the second portion of superconducting material 106*b* is in an insulating state). In some embodiments, the non-superconducting state is a resistive state.

In this example, the first portion 12' of the current $I_1'$ does not exceed the second threshold value for the second device 108*b*. Thus, in response to the first portion $I_2'$ of the current $I_1'$, second device 108*b* does not transition the first portion of superconducting material 106*a* to a non-superconducting state. Rather, the first portion of superconducting material 106*a* remains in a superconducting state. With the second portion of superconducting material 106*b* in a non-superconducting state, a resulting current $I_f$ flows through the electronic component 100 (e.g., from the first branch 104*a* to the third branch 104*c*, based on the serial combination of $R_2$ and $R_L$).

Thus, when a signal is applied in the second direction across the electronic component 100, for at least a pre-defined range of operating conditions (e.g., predefined ranges for load 204 and voltage $V_1$), a path through the electronic component 100 remains in a superconducting state allowing current to flow. In some embodiments, the device state shown in FIG. 3C, with current continuing to flow through the first branch 104*a* but not the second branch 104*b* of device 100, is a steady state of the device 100 (as used herein, the term steady-state refers to a DC behavior of the system or circuit).

Note that the load 204 and the voltage $V_1$ are assumed to be the same in FIGS. 3A-3C as in FIGS. 2A-2C. Thus, for the same load 204 and voltage $V_1$, electronic component 100 has a different impedance depending on the direction along which the signal is applied (e.g., under the predefined range of operating conditions, the electronic component 100 has a different impedance between the first end and the second end as compared to an impedance between the second end and the first end). In some embodiments, various device parameters can be used to tune or adapt the predefined range of operating conditions. For example, in some embodiments, the first resistance $R_1$ and the second resistance $R_2$ are selected to define the predefined range of operating conditions (e.g., by controlling how current is divided between the various branches when the electronic component 100 is coupled with a predefined load).

FIGS. 4-7 illustrate example embodiments of the impedance amplifiers described above (e.g., impedance amplifiers 202*a* and 202*b*). One of skill in the art, however, having had the benefit of this disclosure, will recognize that other impedance amplifiers are possible and fall within the scope of the appended claims.

Figure 4:
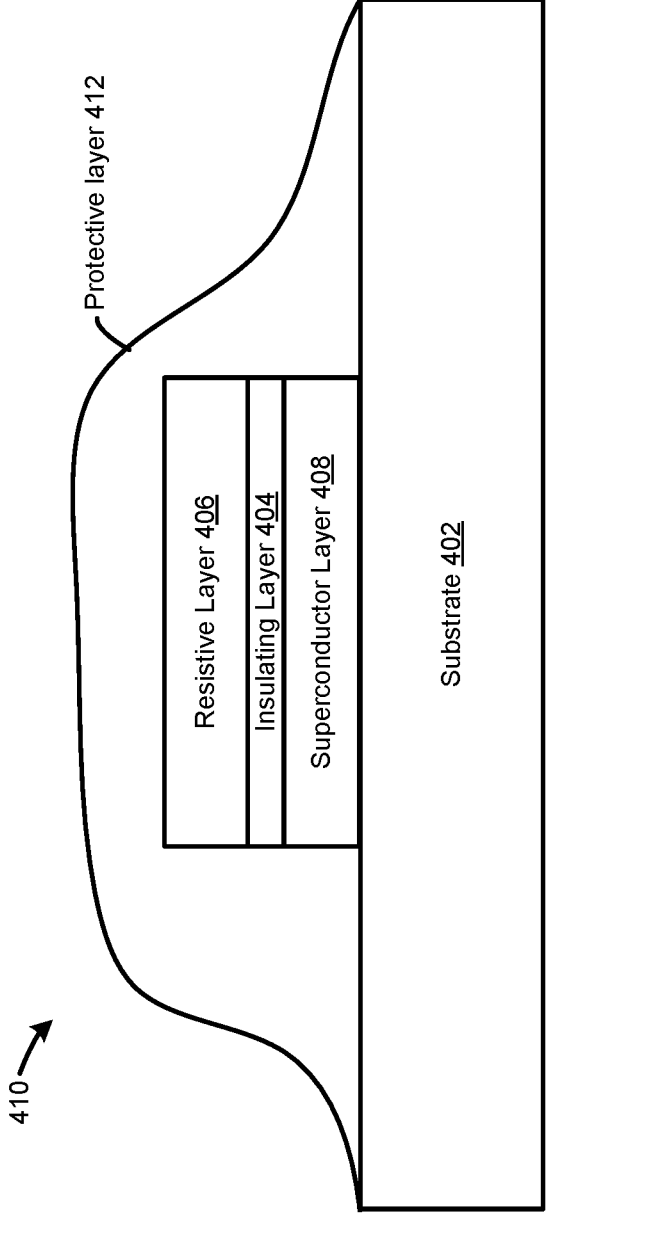
FIG. 4 is a schematic diagram of an impedance amplifier comprising a resistive layer that controls a resistance of a variable resistor (e.g., a superconducting layer), in accordance with some embodiments.

FIG. 4 is a schematic diagram of an impedance amplifier 410 comprising a resistive layer 406 (e.g., a resistive heater) that controls a resistance of a variable resistor (e.g., a superconducting layer 408), in accordance with some embodiments. In some embodiments, the impedance amplifier 410 includes an insulating layer 404 that electrically-insulates, but thermally couples, resistive layer 406 from superconducting layer 408. In some embodiments, the impedance amplifier 410 further includes a protective layer 412. The impedance amplifier 410 is fabricated on a substrate 402.

In some embodiments, the devices 108, described above, may comprise resistive layer 406, while the portions of superconducting material 106, described above, may comprise superconducting layer 408.

In some embodiments, in response to receiving a current, resistive layer 406 generates resistive heat. In some embodiments, impedance amplifier 410 is configured such that, when resistive layer 406 receives a current above a threshold value (e.g., the first threshold value of first device 108*a* or the second threshold value of second device 108*b*, described above), the resistive layer 406 generates sufficient heat (e.g., enough heat transfers to superconducting layer 408) such that the superconducting layer 408 transitions to a non-superconducting (e.g., insulating) state (e.g., by increasing a temperature of the superconducting layer 408 above a superconducting threshold temperature for the superconducting layer 408). In the non-superconducting state, the superconducting layer 408, has a higher resistance than the resistive layer 406, and thus impedance amplification is achieved.

Figure 5:
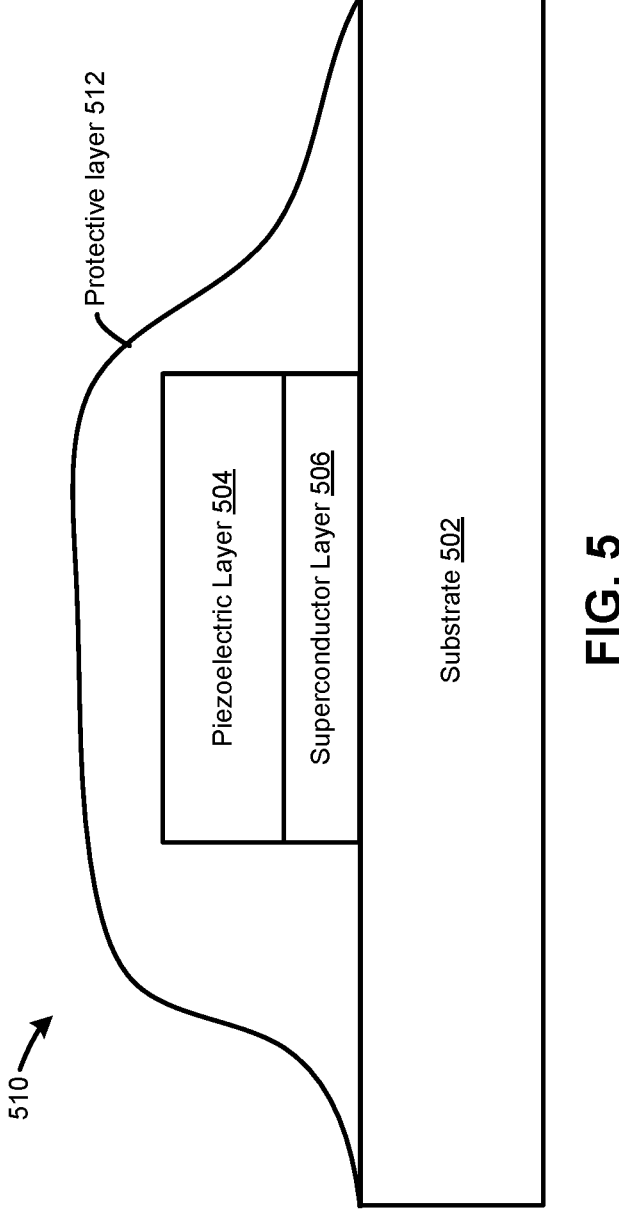
FIG. 5 is a schematic diagram of an impedance amplifier comprising a piezoelectric layer (e.g., a piezoelectric component) that controls a resistance of a variable resistor (e.g., a superconducting layer), in accordance with some embodiments.

FIG. 5 is a schematic diagram of an impedance amplifier 510 comprising a piezoelectric layer 504 (e.g., a piezoelectric component) that controls a resistance of a variable resistor (e.g., a superconducting layer 506), in accordance with some embodiments. The impedance amplifier 510 is fabricated on a substrate 502. In some embodiments, the impedance amplifier 510 further includes a protective layer 512. Note that, in various embodiments, the piezoelectric layer 504 may be below the superconducting layer 506 and may in fact comprise the substrate 502 (e.g., the substrate may be a piezoelectric substrate).

In some embodiments, the devices 108, described above, may comprise piezoelectric layer 504, while the portions of superconducting material 106, described above, may comprise superconducting layer 506.

In some embodiments, when piezoelectric layer 504 receives a current above a threshold value (e.g., the first threshold value of first device 108*a* or the second threshold value of second device 108*b*, described above), superconducting layer 506 undergoes a non-thermal phase transition from a superconducting state to a non-superconducting state (e.g., insulating state) in response to a strain applied by piezoelectric layer 504. In some embodiments, the superconducting layer 506 is adapted to transition between the superconducting state and the non-superconducting state, in response to a strain applied by piezoelectric layer 504, by having a thickness slightly above a superconducting thickness threshold, e.g., within 5 nanometers (nm), 10 nm, or 20 nm of the superconducting thickness threshold.

Thus, when piezoelectric layer 504 receives a current above the threshold value, piezoelectric layer 504 generates a strain in superconducting layer 506 (e.g., by virtue of being epitaxial or lattice-matched with superconducting layer 506). In some embodiments, impedance amplifier 510 is configured such that, when piezoelectric layer 504 receives a current above the threshold value, enough strain is applied to superconducting layer 506 to transition the superconducting layer 506 to a non-superconducting (e.g., insulating) state. In some embodiments, the superconducting layer 506, when in the non-superconducting state, has a higher resistance than the piezoelectric layer 504, and thus impedance amplification is achieved.

Figure 6A:
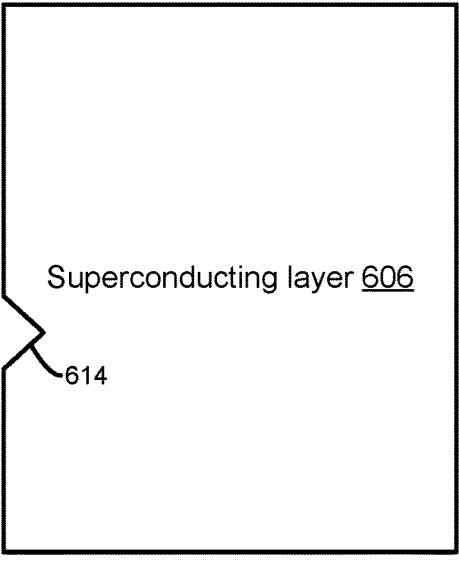
FIGS. 6A-6B are schematic diagrams of an impedance amplifier comprising a superconducting layer that controls a resistance of a variable resistor (e.g., a superconducting layer), in accordance with some embodiments.
Figure 6B:
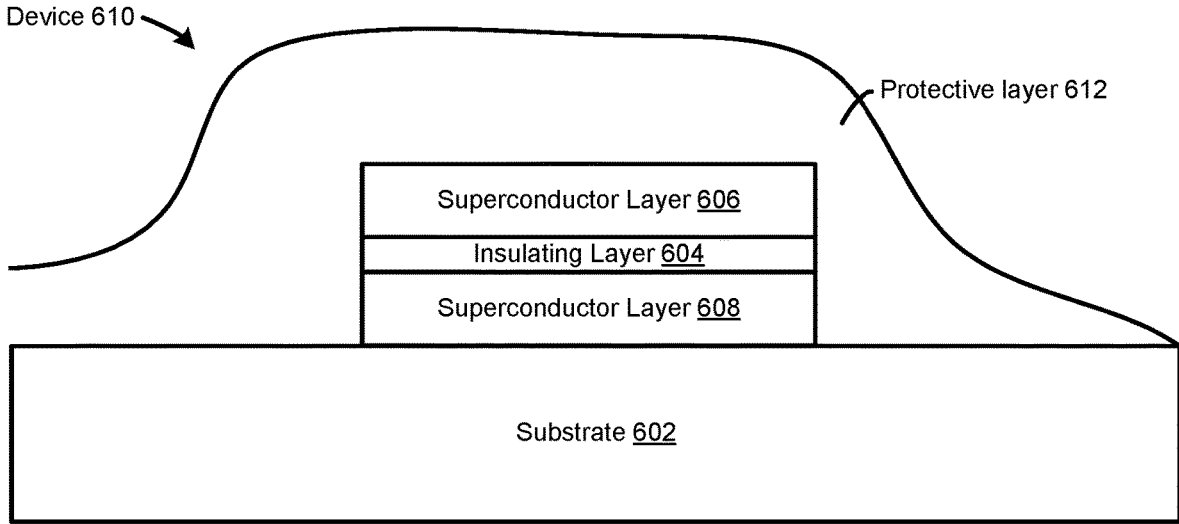

FIGS. 6A-6B are schematic diagrams of an impedance amplifier 610 comprising a first superconducting layer 606 that controls a resistance of a variable resistor (e.g., a second superconducting layer 608), in accordance with some embodiments. The impedance amplifier 610 is fabricated on a substrate 602. In some embodiments, the impedance amplifier 610 includes an insulating layer 604 that electrically-insulates the first superconducting layer 606 from the second superconducting layer 608. In some embodiments, the impedance amplifier 610 further includes a protective layer 612.

In some embodiments, the devices 108, described above, may comprise first superconducting layer 606, while the portions of superconducting material 106, described above, may comprise second superconducting layer 608.

In some embodiments, the first superconducting layer 606 is configured to transition to a non-superconducting state in response to receiving a current above a threshold value (e.g., the first threshold value of first device 108*a* or the second threshold value of second device 108*b*, described above). In some embodiments, the second superconducting layer 608 is configured to transition to a non-superconducting state in response to the first superconducting layer 606 transitioning to a non-superconducting state. For example, in some embodiments, the first superconducting layer 606 generates resistive heat in the non-superconducting state (e.g., resistive state) that transfers to the second superconducting layer 608. In some embodiments, impedance amplifier 610 is configured such that, when the first superconducting layer 606 receives a current above the threshold value, enough heat transfers to second superconducting layer 608 to transition the second superconducting layer 608 to a non-superconducting (e.g., insulating) state. In the non-superconducting state, the second superconducting layer 608 has a higher resistance than the first superconducting layer 606, and thus impedance amplification is achieved.

In some embodiments, the first superconducting layer 606 has one or more geometric features, such as constriction 614, that lower the threshold value for transitioning to a non-superconducting state.

Figure 7:
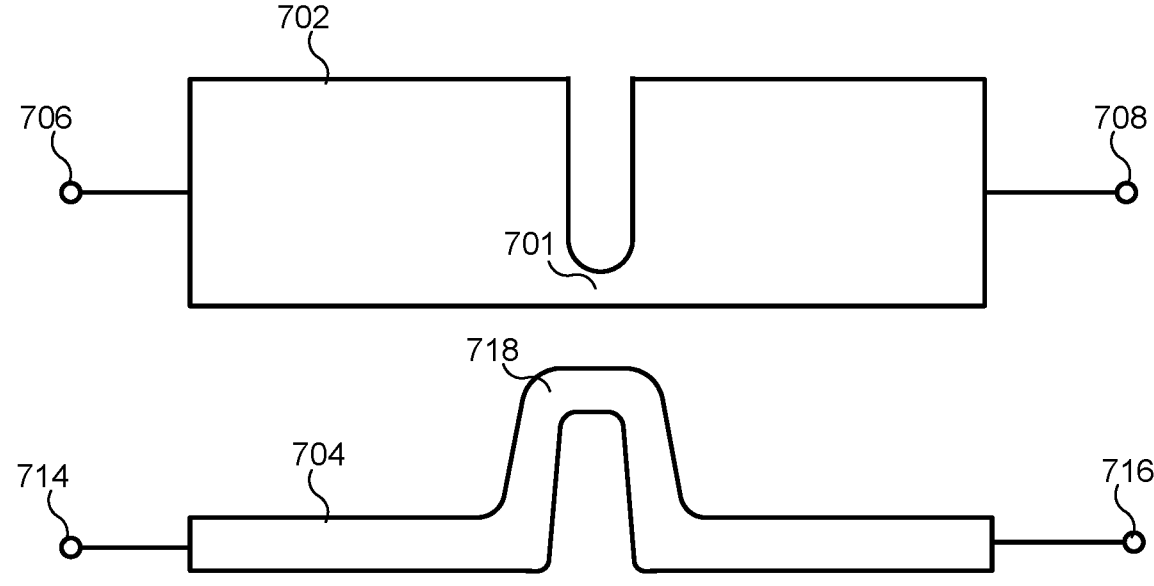
FIG. 7 is a schematic diagram of an impedance amplifier comprising a component (e.g., a resistive or superconducting component) that controls a resistance of a superconducting component (e.g., a superconducting layer), in accordance with some embodiments.

FIG. 7 is a schematic diagram of an impedance amplifier 700 comprising a component 704 that controls a resistance of a variable resistor (e.g., a superconducting component 702), in accordance with some embodiments. In some embodiments, component 704 is a superconductor, while in some other embodiments, component 704 is a non-superconducting component, e.g., a resistive component formed from a metal material, a semiconducting material or any other resistive material. In some embodiments, component 704 comprises a metal and/or doped semiconductor. In embodiments in which component 704 comprises a metal or doped semiconductor, some heat is generated through region 718 of component 704 as current flows between terminals 714 and 716. In some embodiments, component 704 and superconducting component 702 are co-planer (e.g., formed from layers of material that are next to each other). In some embodiments, component 704 and superconducting component 702 are distinct instances of a common layer of material (e.g., superconducting material) deposited on a substrate.

FIG. 7 further shows terminals 706 and 708 connected to the superconducting component 702 and terminals 714 and 716 connected to the component 704. Superconducting component 702 includes constriction region 701 adjacent to region 718 of component 704, which thermally-couples components 702 and 704. Although not shown in FIG. 7, in some embodiments, the components 702 and 704 are thermally coupled by a coupling component.

In some embodiments, each of the devices 108, described above, may comprise an instance of component 704, while each of the portions of superconducting material 106, described above, may comprise an instance of superconducting component 702.

In some embodiments, impedance amplifier 700 is configured such that, when component 704 receives a current above a threshold value (e.g., the first threshold value of first device 108a or the second threshold value of second device 108b, described above), the component 704 generates sufficient heat (e.g., enough heat transfers to superconducting component 702) such that the superconducting component 702 transitions to a non-superconducting (e.g., insulating) state (e.g., by increasing a temperature of the superconducting component 702 above a superconducting threshold temperature for the superconducting component 702). For example, in embodiments in which component 704 comprises a superconductor, a current above the threshold value transitions the region 718 to a non-superconducting state, which generates heat and transitions the constriction region 701 to a non-superconducting state. In the non-superconducting state, the superconducting component 702 has a higher resistance than the resistive layer 406, and thus impedance amplification is achieved.

In some embodiments, only a portion of the component 704, region 718, is in close proximity to the superconducting component 702. In some circumstances, having only a portion of the component 704 in proximity to the superconducting component 702 allows for more control over the heat transfer between the components 702 and 704 and reduces heat dissipation effects of the component 704 by isolating the region 718.

In the embodiments, the superconducting components or regions that are positioned adjacent to each other so as to allow the transfer of heat from one to the other are, at the same time, positioned so as to inhibit (e.g., prevent) cooper pair and/or electron tunneling between those superconducting components or regions (e.g., they are positioned 10 nm, 100 nm, or more apart).

One of skill in the art will appreciate that various other methods and devices for impedance amplification and multiplication may be used. For example, additional embodiments of impedance amplifiers are described in U.S. patent application Ser. No. 16/136,124, entitled "Methods and Devices for Impedance Multiplication," filed Sep. 19, 2018 and U.S. patent application Ser. No. 16/107,143, entitled "Superconductor-to-Insulator Devices," filed Aug. 21, 2018, each of which is incorporated by reference in its entirety.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A diode device, comprising:

a resistive component coupled to a first terminal; and a superconducting component coupled in series between the resistive component and a second terminal;

wherein, under a predefined range of operating conditions:

a current having a first value supplied to the second terminal causes the superconducting component to transition to a non-superconducting state; and the current having the first value supplied to the first terminal does not cause the superconducting component to transition to the non-superconducting state such that the diode device has a different impedance between the first terminal and the second terminal as compared to an impedance between the second terminal and the first terminal.

2. The diode device of claim 1, wherein the resistive component comprises a first resistor having a first resistance, wherein the first resistance is selected to define the predefined range of operating conditions.

3. The diode device of claim 2, wherein the resistive component further comprises a second resistor having a second resistance, wherein the first resistance and the second resistance are selected to define the predefined range of operating conditions.

4. The diode device of claim 1, further comprising a first heating component coupled to a first portion of the superconducting component and configured to generate sufficient heat to cause the first portion of the superconducting component to transition from a superconducting state to the non-superconducting state.

5. The diode device of claim 4, wherein the first heating component is composed of a superconducting material.

6. The diode device of claim 4, wherein the first heating component is composed of a semiconducting material.

7. The diode device of claim 4, wherein the first portion of the superconducting component includes a constriction.

8. The diode device of claim 4, wherein the first heating component is coupled to the first portion of the superconducting component via an electrically-insulating material.

9. The diode device of claim 4, further comprising a second heating component coupled to a second portion of the superconducting component and configured to generate sufficient heat to cause the second portion of the superconducting component to transition from the superconducting state to the non-superconducting state.

10. The diode device of claim 9, wherein the first portion of the superconducting component has a first resistance while in the non-superconducting state and the second portion of the superconducting component has a second resistance while in the non-superconducting state, and wherein the first resistance is different than the second resistance.

11. The diode device of claim 1, wherein the diode device is a thin-film device fabricated on a substrate.

12. The diode device of claim 1, wherein the superconducting component comprises a plurality of nanowires.

13. The diode device of claim 1, wherein the superconducting component comprises a first impedance amplifier, the first impedance amplifier configured to transition between an inactive state and an active state in accordance with a first current threshold.

14. The diode device of claim 13, wherein the first impedance amplifier is in the active state while a current through the first impedance amplifier is greater than the first current threshold, and wherein an impedance of the first impedance amplifier is increased while in the active state.

15. The diode device of claim 13, wherein the superconducting component further comprises a second impedance amplifier, the second impedance amplifier configured to transition between the off state and the on state in accordance with a second current threshold, wherein the second current threshold is different than the first current threshold.

16. The diode device of claim 1, wherein the superconducting component comprises a variable resistor.

17. The diode device of claim 1, wherein the diode device is a passive device that does not consume power when not in use.

18. The diode device of claim 1, wherein the predefined range of operating conditions comprise an operating temperature that is below a superconducting temperature threshold for the superconducting component.

19. The diode device of claim 1, further comprising a piezoelectric component coupled to a portion of the superconducting component and configured to generate sufficient strain to cause the portion of the superconducting component to transition from a superconducting state to the non-superconducting state.

20. The diode device of claim 19, wherein the piezoelectric component comprises a piezoelectric substrate.

\* \* \* \* \*